United States Patent
Wu et al.

(10) Patent No.: US 10,396,711 B2
(45) Date of Patent: Aug. 27, 2019

(54) INTEGRATED CIRCUITS HAVING ON-CHIP INDUCTORS WITH LOW COMMON MODE COUPLING EFFECT

(71) Applicant: Zgmicro Wuxi Corporation, Wuxi, Jiangsu (CN)

(72) Inventors: Yue Wu, Jiangsu (CN); Tianyu Jia, Jiangsu (CN)

(73) Assignee: Zgmicro Wuxi Corporation, Wuxi (CN)

( * ) Notice: Subject to any disclaimer, the term of this patent is extended or adjusted under 35 U.S.C. 154(b) by 73 days.

(21) Appl. No.: 15/826,675

(22) Filed: Nov. 30, 2017

(65) Prior Publication Data

US 2018/0102737 A1    Apr. 12, 2018

Related U.S. Application Data

(63) Continuation of application No. PCT/CN2015/084308, filed on Jul. 17, 2015.

(51) Int. Cl.
*H03B 5/08* (2006.01)
*H01F 27/28* (2006.01)
(Continued)

(52) U.S. Cl.
CPC ........... *H03B 5/08* (2013.01); *H01F 17/0006* (2013.01); *H01F 27/2804* (2013.01); *H01F 27/2823* (2013.01); *H01F 27/29* (2013.01); *H01L 23/5227* (2013.01); *H01L 23/66* (2013.01); *H01L 28/10* (2013.01);
(Continued)

(58) Field of Classification Search
CPC .......... H01F 27/28; H01F 27/29; H01F 17/00; H01L 23/66; H01L 49/02; H01L 23/522; H03B 5/08

USPC ................ 331/167, 117 FE, 108 C; 257/531; 336/200

See application file for complete search history.

(56) References Cited

U.S. PATENT DOCUMENTS

2013/0321116 A1* 12/2013 Tiemeijer ............ H01F 27/2804
                                                        336/200

OTHER PUBLICATIONS

Marc Tiebout, Low-Power Low Phase Noise Differentially Tuned Quadrature VCO Design in Standard CMOS, IEEE Jl. of Solid State Circuits, vol. 36, No. 7, Jul. 2001 (Year: 2001).*

* cited by examiner

*Primary Examiner* — Arnold M Kinkead
(74) *Attorney, Agent, or Firm* — Joe Zheng

(57) ABSTRACT

Techniques pertaining to designs of integrated circuits having on-chip inductors with low common mode coupling effect are described. According to one aspect of the present invention, an integrated circuit is designed to have a first circuit operating at a first frequency and including a first inductor, and a second circuit including a second inductor and provided to process an input signal. The second circuit includes a second inductor and is provided to process an input signal. The second inductor includes a first terminal, a second terminal, an intermediate terminal, and an intermediate node, wherein a first wire is formed between the first terminal and the intermediate node, a second wire is formed between the intermediate node and the second terminal, and an intermediate tap is coupled between the intermediate node and the intermediate terminal, the first wire and the second wire forming a coil with one or more turns, and the first terminal, the second terminal and the intermediate terminal of the second inductor being located on one side of the coil and adjacent to each other.

11 Claims, 8 Drawing Sheets

(51) Int. Cl.
*H01F 27/29* (2006.01)
*H01L 23/66* (2006.01)
*H01L 49/02* (2006.01)
*H01L 23/522* (2006.01)
*H01F 17/00* (2006.01)

(52) U.S. Cl.
CPC ............... *H01L 2223/6611* (2013.01); *H01L 2223/6638* (2013.01); *H03B 2200/0088* (2013.01)

US 10,396,711 B2

INTEGRATED CIRCUITS HAVING ON-CHIP INDUCTORS WITH LOW COMMON MODE COUPLING EFFECT

BACKGROUND OF THE INVENTION

1. Field of the Invention

The present invention relates to the area of an integrated circuit, and in particular, to integrated circuits having on-chip inductors with low common mode coupling effect.

2. Description of Related Art

With development of CMOS-based (Complementary Metal Oxide Semiconductor Transistor) radio frequency integrated circuits (RFICs), an on-chip inductor has become a key element in a radio frequency integrated circuit. It has been widely used in circuits such as filters, LNAs (Low Noise Amplifiers) and VCOs (Voltage Controlled Oscillators), and etc. The integrated circuit based on the GaAs (gallium arsenide) process or the CMOS process generally uses several on-chip inductors. The area occupied by the on-chip inductor is large, and a coupling effect of the on-chip inductor to other element will affect overall performance of the integrated circuit directly. Hence, decoupling design of the on-chip inductor is very important. In a number of previous studies, many decoupling techniques have been developed. For example, a patterned shielding is disposed under an on-chip inductor or a guard ring is disposed around the on-chip inductor to reduce the coupling effect of the on-chip inductor to other element. However, the conventional decoupling designs are developed primarily to aim at a differential mode current input, and the coupling effect of a common mode input current is ignored. With respect to how to eliminate the coupling effect of the common mode input current between the on-chip inductors, there are not enough attention and researches in the prior art.

FIG. 1 shows a schematic circuit diagram of a conventional radio frequency integrated circuit. As shown in FIG. 1, the radio frequency integrated circuit comprises a voltage controlled oscillator 110, a frequency divider 120, an up-converter 130 and a driver amplifier 140. The voltage controlled oscillator 110 has a capacitor C1 and an inductor L1 connected in parallel, and may produce an oscillating clock signal with a frequency fVCO. The frequency divider 120 is provided to divide the oscillating clock signal by two to obtain two local oscillating clock signals with phase difference of 90 degrees. As expressed, the frequency of the local oscillating clock signal is fLO=fVCO/2. The up-converter 130 modulates a base-band input signal into an initial radio frequency signal based on the local oscillating clock signals, where a frequency of the base-band input signal is fm, a frequency of the initial radio frequency signal is fS, and fS=fLO+fm. The driver amplifier 140 is provided to amplify the initial radio frequency signal to obtain an amplified radio frequency signal. The amplified radio frequency signal is emitted out via an antenna 150.

The up-converter 130 has an inductor L2 and a capacitor C2 connected in parallel. The driver amplifier 140 has a capacitor C3 and an inductor L3 connected in parallel, and an inductor L4 coupled with the inductor L3 to form a transformer. The frequency of the even harmonic of the radio frequency signal is 2*fS, which is close to the frequency fVCO of the oscillating clock signal. Therefore, the even harmonic of the radio frequency signal would disturb the voltage controlled oscillator and introduce noise into the oscillating clock signal from the voltage controlled oscillator. To overcome these problems, either a complex calibration circuit is added into the voltage controlled oscillator, or a different local oscillating signal generation circuit is employed. Ether of these approaches will cause extra power consumption and a larger chip area. Therefore, it is necessary to provide an improved technical solution to solve the above problems.

SUMMARY OF THE INVENTION

This section is for the purpose of summarizing some aspects of the present invention and to briefly introduce some preferred embodiments. Simplifications or omissions in this section as well as in the abstract or the title of this description may be made to avoid obscuring the purpose of this section, the abstract and the title. Such simplifications or omissions are not intended to limit the scope of the present invention.

In general, the present invention is related to designs of integrated circuits having on-chip inductors with low common mode coupling effect. According to one aspect of the present invention, an integrated circuit is designed to have a first circuit operating at a first frequency and including a first inductor, and a second circuit including a second inductor and provided to process an input signal. The second circuit includes a second inductor and is provided to process an input signal. The second inductor includes a first terminal, a second terminal, an intermediate terminal, and an intermediate node, wherein a first wire is formed between the first terminal and the intermediate node, a second wire is formed between the intermediate node and the second terminal, and an intermediate tap is coupled between the intermediate node and the intermediate terminal, the first wire and the second wire forming a coil with one or more turns, and the first terminal, the second terminal and the intermediate terminal of the second inductor being located on one side of the coil and adjacent to each other.

One of the features, benefits and advantages in the present invention is to provide designs for minimizing common mode coupling effect in an integrated circuit.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE INVENTION

The detailed description of the present invention is presented largely in terms of procedures, steps, logic blocks, processing, or other symbolic representations that directly or indirectly resemble the operations of devices or systems contemplated in the present invention. These descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams or the use of sequence numbers representing one or more embodiments of the invention do not inherently indicate any particular order nor imply any limitations in the invention.

Exemplary embodiments of the invention will be described in detail in connection with the drawings. It is found that both the up-converter 130 and the driver amplifier 140 in FIG. 1 have a pseudo-differential circuit which may produce large even harmonic current of the input signal. The even harmonic currents will be coupled into the inductor of the voltage controlled oscillator 110 via the inductors of the pseudo-differential circuit since frequencies of the even harmonic currents are close to the frequency of the oscillating clock signal from the voltage controlled oscillator 110, thereby introducing noise into the oscillating clock signal from the voltage controlled oscillator 110.

Figure 2:
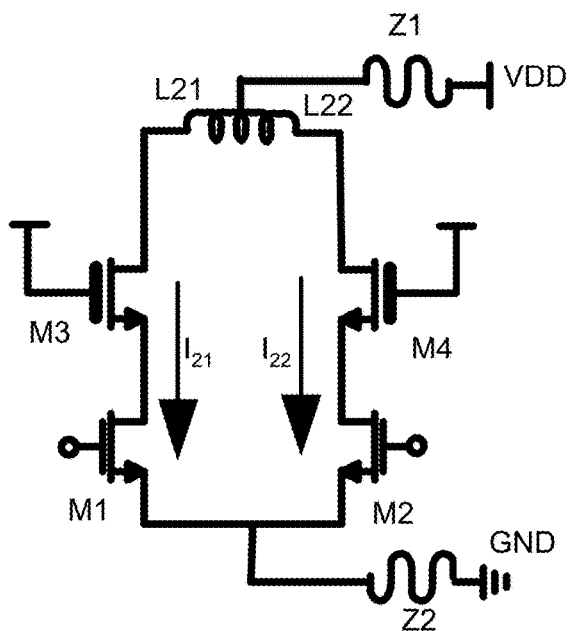
FIG. 2 is a schematic circuit diagram showing one embodiment of a pseudo-differential circuit.

FIG. 2 is a schematic circuit diagram showing a pseudo-differential circuit according to one embodiment of the present invention. The pseudo-differential circuit includes an inductor L21, an inductor L22, a first bias transistor M3, a second bias transistor M4, a first differential transistor M1 and a second differential transistor M2. One terminal of the inductor L21 is coupled with one terminal of the inductor L22, and then is coupled to a power supply voltage terminal VDD. The first bias transistor M3 and the first differential transistor M1 are coupled in series in turn between the other terminal of the inductor L21 and a ground terminal GND. The second bias transistor M4 and the second differential transistor M2 are coupled in series in turn between the other terminal of the inductor L22 and the ground terminal GND. One of two differential input signals is applied to a control terminal of the first differential transistor M1, and the other one of the differential input signals is applied to a control terminal of the second differential transistor M2. Both control terminals of the first bias transistor M3 and the second bias transistor M4 are respectively coupled with a bias voltage. The first bias transistor M3 and the first differential transistor M1 form a first differential branch, and the second bias transistor M4 and the second differential transistor M2 form a second differential branch.

In one embodiment, the bias transistors and the differential transistors M1-M4 may be MOS field effect transistors, bipolar transistors, or other type transistors. In some embodiments, other elements may be added in the pseudo-differential circuit, for example, a resistor, an inductor or a transistor, and etc. The inductors L21 and L22 belong to the same inductor in the structure, and the two inductors L21 and L22 may also be called as one inductor, which has an intermediate terminal coupling with the power supply voltage terminal VDD. In FIG. 2, impedances Z1 and Z2 coupled with the power supply voltage terminal VDD and the ground terminal GND respectively are parasitic impedances of connecting wires of the power supply voltage terminal VDD and the ground terminal GND respectively.

At one moment, as shown in FIG. 2, even harmonic currents I1 and I2 of the differential input signals are flowing from the inductor L21 to the first differential branch, and flowing from the inductor L22 to the second differential branch respectively. At another moment, the even harmonic currents I1 and I2 of the differential input signals are flowing from the first differential branch to the inductor L21, and flowing from the second differential branch to the inductor L22, respectively. The even harmonic currents may be called as common mode currents. The even harmonic currents flowing through the inductors L21 and L22 generate a magnetic field to affect the inductor in the voltage controlled oscillator by coupling means.

Figure 3A:
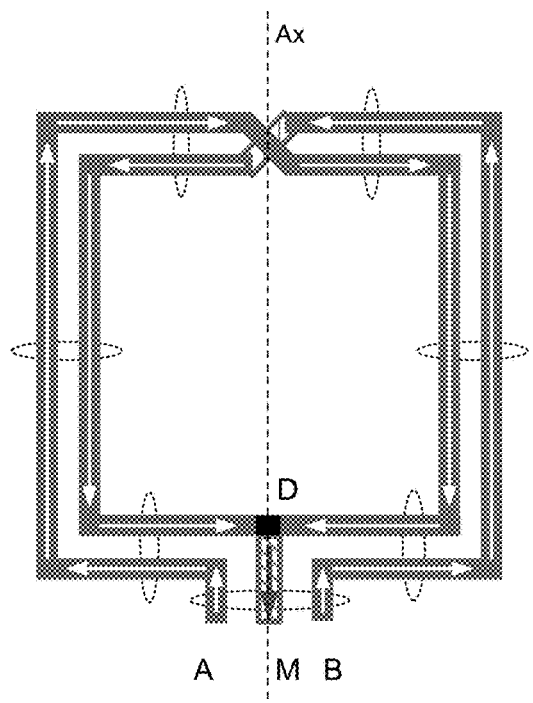
FIG. 3A is a structure diagram showing the use of an on-chip inductor in one embodiment of the present invention.

FIG. 3A is a structure diagram showing a first embodiment of an on-chip inductor in the present invention. As shown in FIG. 3A, the on-chip inductor includes a first terminal A, a second terminal B, an intermediate terminal M, an intermediate node D. There is a first wire going between the first terminal A and the intermediate node D. There is also a second wire going between the intermediate node D and the second terminal B. Further there is an intermediate tap coupled between the intermediate node D and the intermediate terminal M. The first wire and the second wire form a coil with two loops or turns. The intermediate tap does not need to pass through a center of the loops because the number of turns of the coil is an even number. Thus, the first terminal A, the second terminal B and the intermediate terminal M are located on the same side of the coil and adjacent to each other. Both of the first and second wires are symmetric about a symmetric axis Ax. The first terminal A is adjacent to the symmetric axis Ax and located on one side of the symmetric axis Ax while the second terminal B is adjacent to the symmetric axis and located on the other side of the symmetric axis Ax. In particular, the intermediate tap is located on the symmetric axis Ax. The cross sections of the first and the second wires are located on different layers according to one embodiment of the present invention.

In one embodiment, the wire conductor from the first terminal A to the intermediate terminal M may be regarded as the inductor L21 in FIG. 2, and the wire conductor from the second terminal B to the intermediate terminal M may be regarded as the inductor L22 in FIG. 2. Of course, the inductor in FIG. 3A may be used not only in the pseudo-differential circuit as shown in FIG. 2, but also used in other circuits.

As shown in FIG. 3A, when a common mode currents flows in the on-chip inductor, i.e., the currents flow from A to M and from B to M, or the currents flow from M to A and from M to B, the magnetic fields generated by the currents flowing on the coil formed by the first wire and the second wire may be cancelled out substantially by each other because the currents in all the adjacent wires have identical magnitudes but in opposite directions. For example, the magnetic fields generated by the currents at positions going through two or three adjacent wires encircled by each dashed circle in FIG. 3A are cancelled out by each other (e.g., a region involving the first terminal A, the second terminal B and the intermediate terminal M), where arrows in the wires in FIG. 3A are the directions of the currents. Thus, when the common mode currents flow in the on-chip inductor, the magnetic field generated by the on-chip inductor as a whole is very small, and the common mode coupling effect of the on-chip inductor to other inductors in one and the same die is also reduced greatly. In brief, the on-chip inductor as shown in FIG. 3A adopts a magnetic field difference structure.

As shown in FIG. 3A, the number of turns of the coil of the on-chip inductor is 2, which is an even number. In other embodiment, the number of turns of the coil formed by the first wire and the second wire may be any other even number, e.g., 4 turns, 6 turns, etc-. The structure of the on-chip inductor with an even number of turns is similar to the structure of the on-chip inductor as shown in FIG. 3A. The key in the on-chip inductor is that the first terminal A, the second terminal B and the intermediate terminal M are located on the same side of the coil and adjacent to each other and the intermediate tap does not pass through the center of the coil.

Figure 3B:
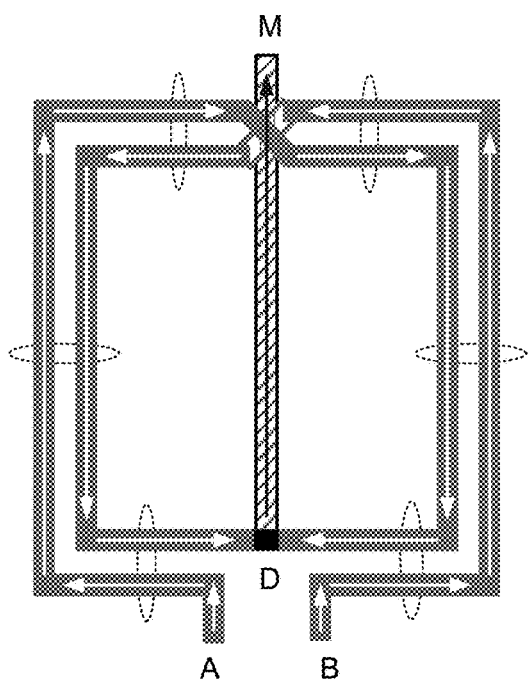
FIG. 3B is a structure diagram of an on-chip inductor having different intermediate tap structure with the on-chip inductor shown in FIG. 3A.

FIG. 3B is another exemplary diagram of an on-chip inductor having different intermediate tap structure from the one shown in FIG. 3A. The structure of the on-chip inductor shown in FIG. 3B is substantially identical to the one in FIG. 3A except for the intermediate tap structure. The number of turns of the coil in the on-chip inductor shown in FIG. 3B is 2. Differences between the two on-chip inductor shown in FIG. 3A and FIG. 3B is that the intermediate tap of the on-chip inductor shown in FIG. 3B passes through the center of the coil formed by the first wire and the second wire, and the intermediate terminal M is not adjacent to the first terminal A and the second terminal B, but located on a different side of the coil. When the common mode currents flow on the on-chip inductor shown in FIG. 3B, the magnetic fields generated by the currents flowing on the coil formed by the first wire and the second wire can be cancelled out substantially by each other, but the magnetic field generated by the current on the intermediate tap cannot be cancelled out. Thus, the on-chip inductor shown in FIG. 3B as a whole will generate a large magnetic field and have a strong common mode coupling effect to other inductors in one and the same die when the common mode currents flow in it. In brief, the on-chip inductor as shown in FIG. 3B does not adopt the magnetic field difference structure.

Figure 4A:
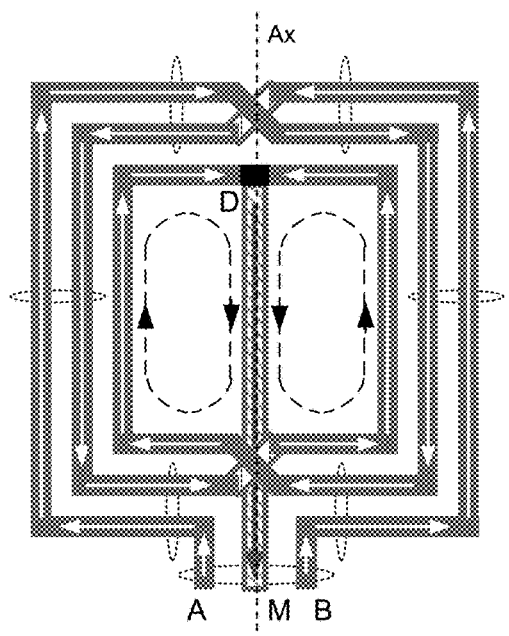
FIG. 4A is a structure diagram showing the use of the on-chip inductor with more turns in one embodiment of the present invention.
Figure 4B:
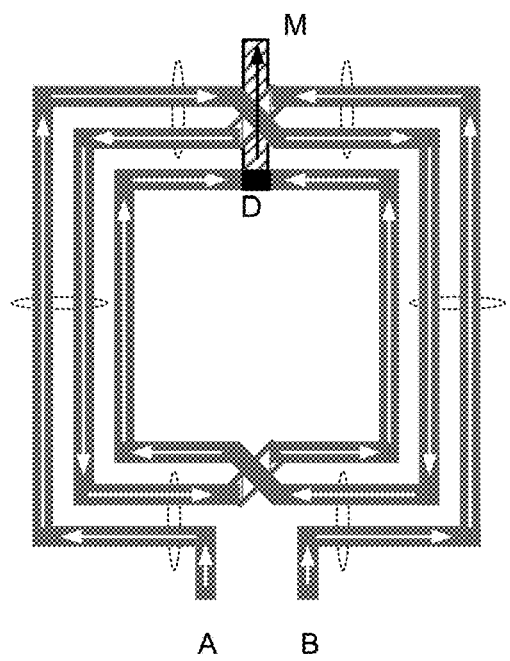
FIG. 4B is a structure diagram of an on-chip inductor having different intermediate tap structure with the on-chip inductor shown in FIG. 4A.

FIG. 4A shows an exemplary on-chip inductor according to one embodiment of the present invention. The structure of the on-chip inductor of FIG. 4A is similar to that of the on-chip inductor in FIG. 3A. One of the differences between the two on-chip inductors in FIG. 4A and FIG. 4B is that the number of turns of the coil of the on-chip inductor in FIG. 4A is an odd number (i.e., 3), and the intermediate tap passes through the center of the coil. Thus, the intermediate terminal M, the first terminal A and the second terminal B of the on-chip inductor in FIG. 4A still are adjacent to each other and located on the same side of the coil though the number of turns of the coil in FIG. 3A is the even number, and the number of turns of the coil in FIG. 4A is the odd number.

As shown in FIG. 4A, when the common mode currents flow in the on-chip inductor, i.e., the currents flow respectively from A to M and from B to M, or the currents flow from M to A and from M to B, the magnetic fields generated by the currents flowing on even number of turns (2 turns) of the coil are cancelled out substantially by each other, and the magnetic fields generated by the currents flowing in one turn of the coil coupled directly with the intermediate node D are substantially cancelled out by the magnetic fields generated by the current flowing in a part of the intermediate tap. For example, the magnetic fields generated by the currents at positions of two or three (the region where the first terminal A, the second terminal B and the intermediate terminal M are located) adjacent wires encircled by each dashed circles in FIG. 4A are cancelled out by each other. An innermost turn of the coil and the part of the intermediate tap form two rings. The magnetic fields generated by the currents in the innermost turn of the coil are substantially cancelled out by the magnetic fields generated by the currents on the part of the intermediate tap. Thus, when the common mode currents flow on the on-chip inductor shown in FIG. 4A, the magnetic field generated by the on-chip inductor as a whole is very small, and the common mode coupling effect of the on-chip inductor to other inductors in one and the same die is also reduced greatly. In brief, the on-chip inductor as shown in FIG. 4A adopts the magnetic field difference structure.

As shown in FIG. 4A, the number of turns of the coil of the on-chip inductor therein is 3 which is an odd number. In other embodiment, the number of turns of the coil formed by the first wire and the second wire may be other odd number of turns, e.g., 1 turn, 5 turns, 7 turns, etc. The structure of the on-chip inductor with other odd number of turns is substantially similar to the structure of the on-chip inductor in FIG. 4A. The key identical structure is that the intermediate tap passes through the center of the coil so as to ensure that the first terminal A, the second terminal B and the intermediate terminal M are located on the same side of the coil and adjacent to each other.

FIG. 4B is a structure diagram of an on-chip inductor having different intermediate tap structure with the on-chip inductor shown in FIG. 4A. The structure of the on-chip inductor shown in FIG. 4B is substantially identical to the on-chip inductor in FIG. 4A except for the intermediate tap. The numbers of turns of the coil of the on-chip inductor shown in FIG. 4B is 3. One of the differences between the two on-chip inductor shown in FIG. 4A and FIG. 4B is that the intermediate tap of the on-chip inductor in FIG. 4B does not pass through the center of the coil formed by the first wire and the second wire, and the intermediate terminal M is not adjacent to the first terminal A and the second terminal B, but located on a different side of the coil. When the common mode currents flow in the on-chip inductor in FIG.

4B, the magnetic fields generated by the currents on the innermost turn of the coil cannot be cancelled out. Thus, the on-chip inductor shown in FIG. 4B as a whole will generate a stronger magnetic field and have a strong common mode coupling effect to other inductors in one and the same die when the common mode currents flow in it. In brief, the on-chip inductor as shown in FIG. 4B does not adopt the magnetic field difference structure.

Figure 5A:
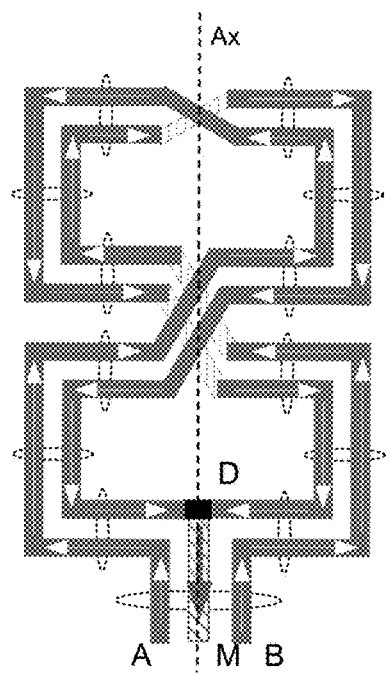
FIG. 5A is a structure diagram showing the use of the on-chip inductor with different turns in one embodiment of the present invention.

FIG. 5A is a structure diagram showing another embodiment of an on-chip inductor in the present invention. The structure of the on-chip inductor shown in FIG. 5A is similar to that of the on-chip inductor in FIG. 3A. One of the differences between the two on-chip inductor shown in FIG. 5A and FIG. 3A is that, each turn of the coil formed by the first wire and the second wire in FIG. 5A comprises two parts, an upper sub-coil located on the upper side and a lower sub-coil located on the lower side. The number of turns of the coil formed by the first wire and the second wire shown in FIG. 5A is 2. The key structure of the on-chip inductor shown in FIG. 5A is that the intermediate terminal M is adjacent to the first terminal A and the second terminal B and located on the same side of the coil, and the intermediate tap does not pass through the center of the coil. Namely, the on-chip inductor as shown in FIG. 5A also adopts the magnetic field difference structure. When the common mode currents flow in the on-chip inductor in FIG. 5A, the magnetic field generated by the on-chip inductor as a whole is very small, and the common mode coupling effect of the on-chip inductor to other inductors in one and the same die is also reduced considerably.

As shown in FIG. 5A, each coil of the on-chip inductor therein comprises two sub-coils. In other embodiments, each coil of the on-chip inductor may further comprise more sub-coils, e.g., 3 sub-coils, 4 sub-coils and more. No matter how many sub-coils each coil has, as long as the number of turns of the coil is an even number, the intermediate tap of the on-chip inductor does not need to pass through the center of the coil formed by the first wire and the second wire to ensure that the intermediate terminal M is adjacent to the first terminal A and the second terminal B and located on the same side of the coil. As long as the number of turns of the coil is an odd number, the intermediate tap of the on-chip inductor need to pass through the center of the coil formed by the first wire and the second wire so as to ensure that the intermediate terminal M is adjacent to the first terminal A and the second terminal B and located on the same side of the coil.

Figure 5B:
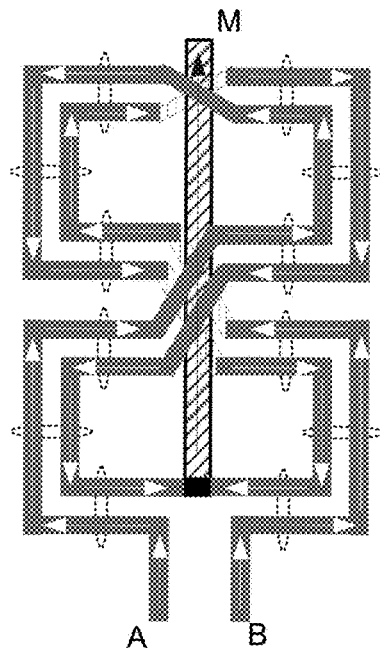
FIG. 5B is a structure diagram of an on-chip inductor having different intermediate tap structure with the on-chip inductor shown in FIG. 5A.

FIG. 5B is a structure diagram of an on-chip inductor having different intermediate tap structure from the one shown in FIG. 5A. The structure of the on-chip inductor shown in FIG. 5B is substantially identical to that in FIG. 5A except for intermediate tap structure. One of the differences between the two on-chip inductors respectively shown in FIG. 5A and FIG. 5B is that the intermediate tap of the on-chip inductor in FIG. 5B passes through the center of the coil formed by the first wire and the second wire, and the intermediate terminal M is not adjacent to the first terminal A and the second terminal B, but located on a different side of the coil. Clearly, the on-chip inductor as shown in FIG. 5B does not adopt a magnetic field difference structure. When the common mode currents flow on the on-chip inductor shown in FIG. 5B, the on-chip inductor as a whole will generate a stronger magnetic field, and the common mode coupling effect of the on-chip inductor to other inductors in one and the same die will also be larger.

As shown in FIG. 2, to reduce the common mode coupling effect of the inductors L21 and L22 in the pseudo-differential circuit to an external inductor, the inductors L21 and L22 preferably adopt the on-chip inductors as shown in FIG. 3A, FIG. 4A or FIG. 5A which employ the magnetic field difference structure.

Figure 1:
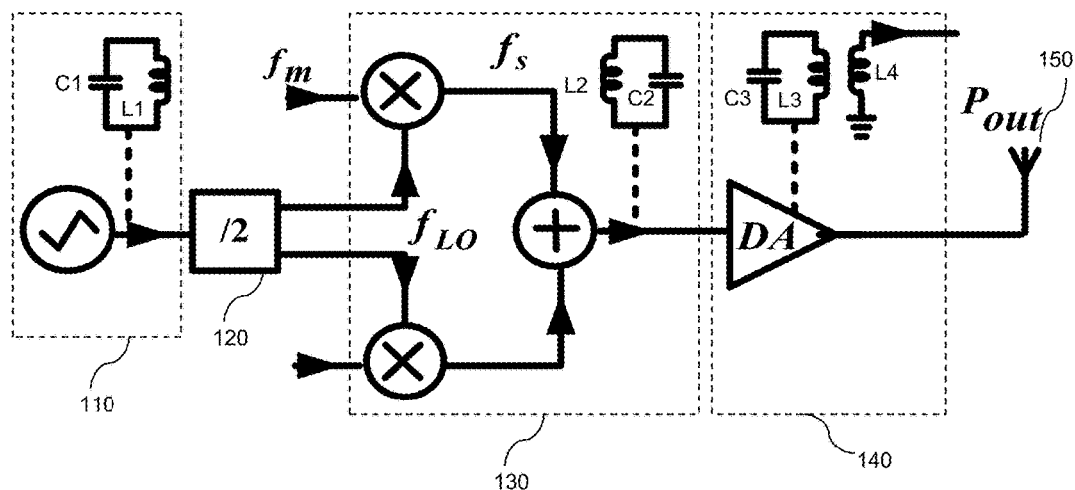
FIG. 1 is a schematic circuit diagram showing a conventional radio frequency integrated circuit.
Figure 6:
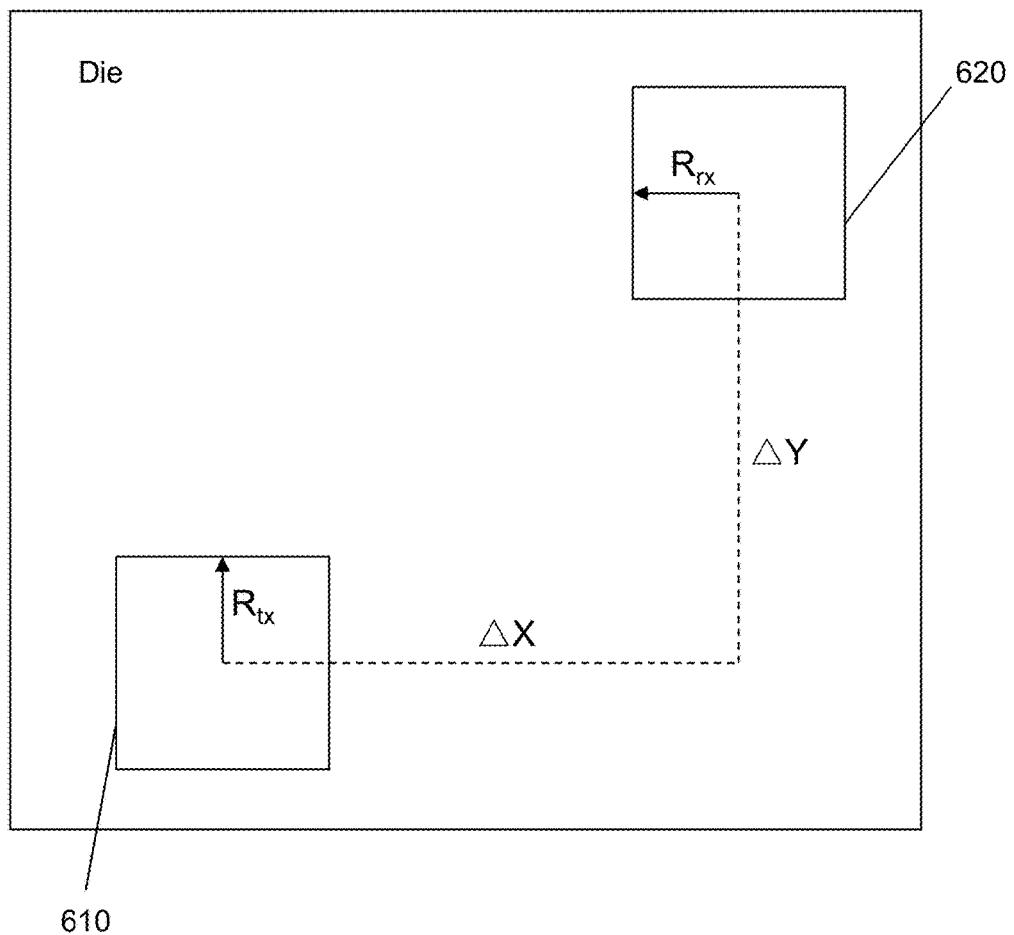
FIG. 6 is a schematic diagram showing two on-chip inductors disposed on a die.

FIG. 6 is a schematic diagram showing two on-chip inductors on a die. A first on-chip inductor 610 and a second on-chip inductor 620 are shown in the FIG. 6. The distances between centers of the two inductors along the X-axis and the Y-axis are $\Delta X$ and $\Delta Y$, respectively. When discussing coupling effect between the two inductors, the first on-chip inductor 610 may be taken as a transmitter (TX) inductor Ltx, and the on-chip inductor 620 may be taken as a receiver (RX) inductor Lrx. For example, as shown in FIG. 1 and FIG. 2, the inductors L21 and L22 in the pseudo-differential circuit may be taken as the transmitter inductor, and the inductor in the voltage controlled oscillator may be taken as the receiver inductor. When the distances $\Delta X$ and $\Delta Y$ are far greater than the inductor radius Rtx and Rrx, it may be considered that changes of the inductor radius have small influence on the coupling effect between the two inductors.

Figure 7:
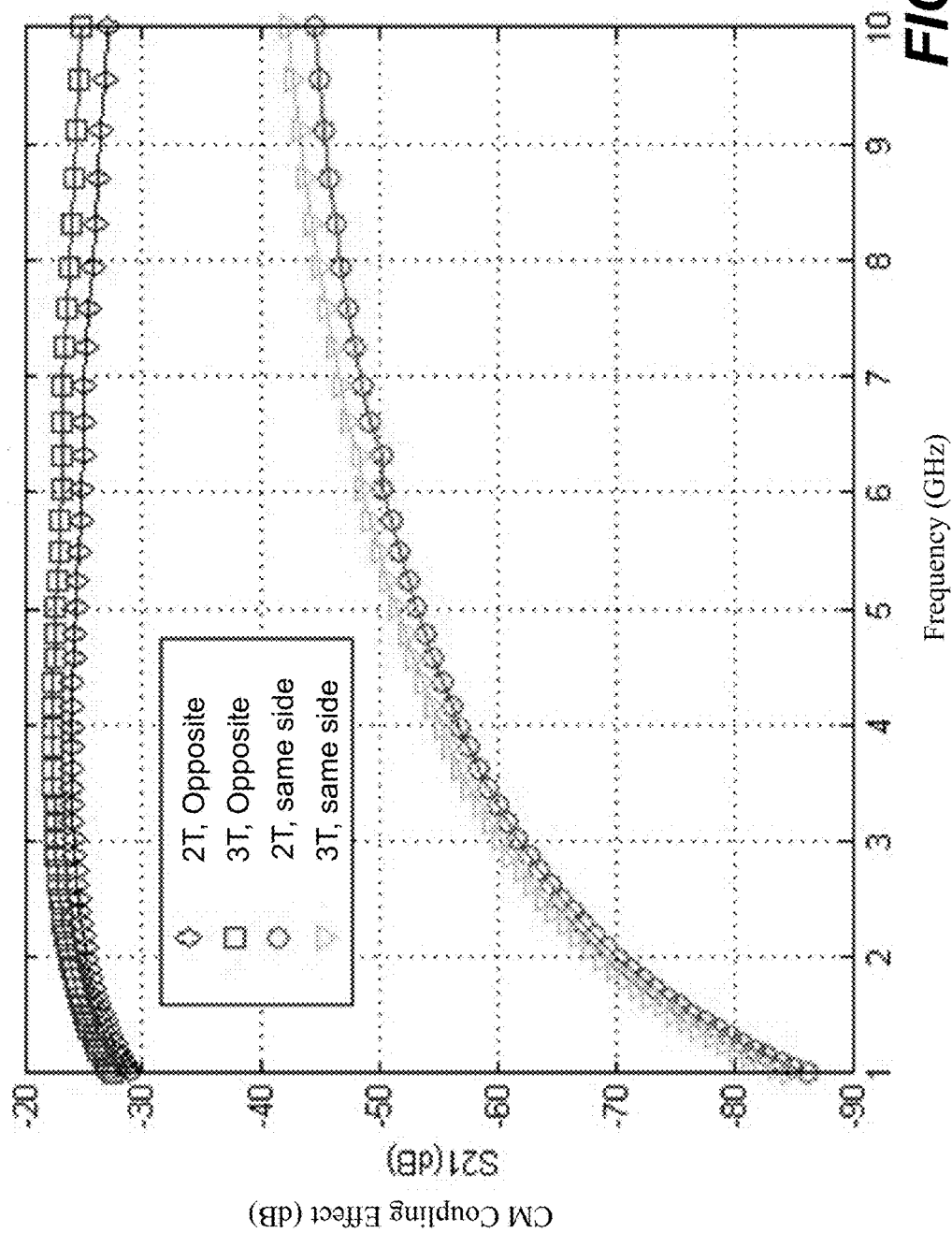
FIG. 7 shows a curve schematic diagram of common mode coupling effect between a transmitter inductor and a receiver inductor when the transmitter inductor adopts the on-chip inductor as shown in FIG. 3A, FIG. 3B, FIG. 4A, FIG. 4B, FIG. 5A and FIG. 5B respectively.

Taking the case in FIG. 6 as an example, it is designed that Ltx=1 nH, Lrx=2 nH, $\Delta X=\Delta Y=1000$ μm>>Rtx, Rrx, and the number of turns of the coil of the inductor Lrx is 5. FIG. 7 shows a curve schematic diagram of the common mode coupling effect between the transmitter inductor and the receiver inductor when the transmitter inductor 610 adopts the on-chip inductor structure as shown in FIG. 3A, FIG. 3B, FIG. 4A or FIG. 4B. A curve formed by a series of diamonds is a curve of the common mode coupling effect between the transmitter inductor and the receiver inductor when the transmitter inductor 610 adopts the on-chip inductor structure as shown in FIG. 3B. A curve formed by a series of squares is a curve of the common mode coupling effect between the transmitter inductor and the receiver inductor when the transmitter inductor 610 adopts the on-chip inductor structure as shown in FIG. 4B. A curve formed by a series of circles is a curve of the common mode coupling effect between the transmitter inductor and the receiver inductor when the transmitter inductor 610 adopts the on-chip inductor structure as shown in FIG. 3A. A curve formed by a series of triangles is a curve of the common mode coupling effect between the transmitter inductor and the receiver inductor when the transmitter inductor 610 adopts the on-chip inductor structure as shown in FIG. 4A. In one embodiment, the frequency of the differential input signals is about 2.5 GHz, and it can be seen from FIG. 7 that the common mode coupling effect at 5 GHz (the frequency of the second harmonic of the differential input signals) between the TX inductor and the RX inductor is about −55 dB to −50 dB when the TX inductor adopts the inductor structures as shown in FIG. 3A and FIG. 4A, and the common mode coupling effect between the two inductors is very small. The common mode coupling effect at 5 GHz between the TX inductor and the RX inductor is about −25 dB when the TX inductor adopts the inductor structures as shown in FIG. 3B and FIG. 4B, and the common mode coupling effect between the two inductors is greater by about 25 dB than when the TX inductor adopts the magnetic field difference structure.

As shown in FIG. 2, the wires connecting the power supply voltage terminal VDD and the ground terminal GND have parasitic impedances. The even harmonic currents of the differential input signals in the pseudo-differential circuit may further cause the power supply voltage to fluctuate via the parasitic impedances Z1 and Z2. The fluctuation of the power supply voltage may be conducted to the power supply voltage terminal of the voltage controlled oscillator. Thus, the voltage controlled oscillator is disturbed.

Figure 8:
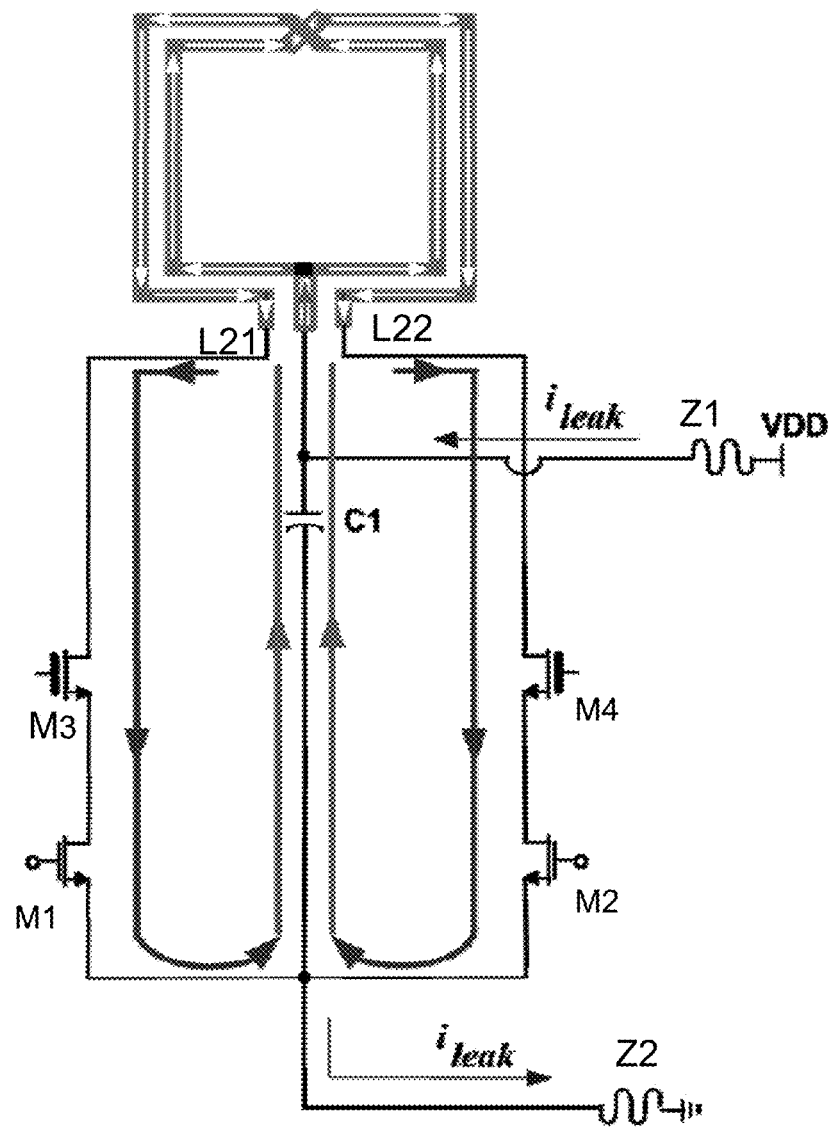
FIG. 8 is a schematic diagram showing another embodiment of the pseudo-differential circuit, wherein a tuning capacitor is added.

To solve the problem, one embodiment of the present invention proposes an improved pseudo-differential circuit. As shown in FIG. 8, the on-chip inductors are displayed in a physical structure. The pseudo-differential circuit further comprises a tuning capacitor C1 coupled between the intermediate terminal of the inductors L21 and L22 and the ground terminal (e.g., the intermediate terminal and the ground terminal of the on-chip inductor in FIG. 3A). The tuning capacitor C1 and the inductors L21 and L22 form a notch filter having a resonant frequency being proximate or equal to the frequency of the even harmonic of the differential input signals. The even harmonic currents of the differential input signals may be circulated among the inductors L21 and L22, the bias transistors M3 and M4, the differential transistors M1 and M2, and the tuning capacitor C1. Even harmonic currents Ileak leaked to the power supply voltage terminal VDD and the ground terminal GND are greatly decreased, thereby greatly reducing the influence of the even harmonic currents on the power supply voltage.

Figure 9:
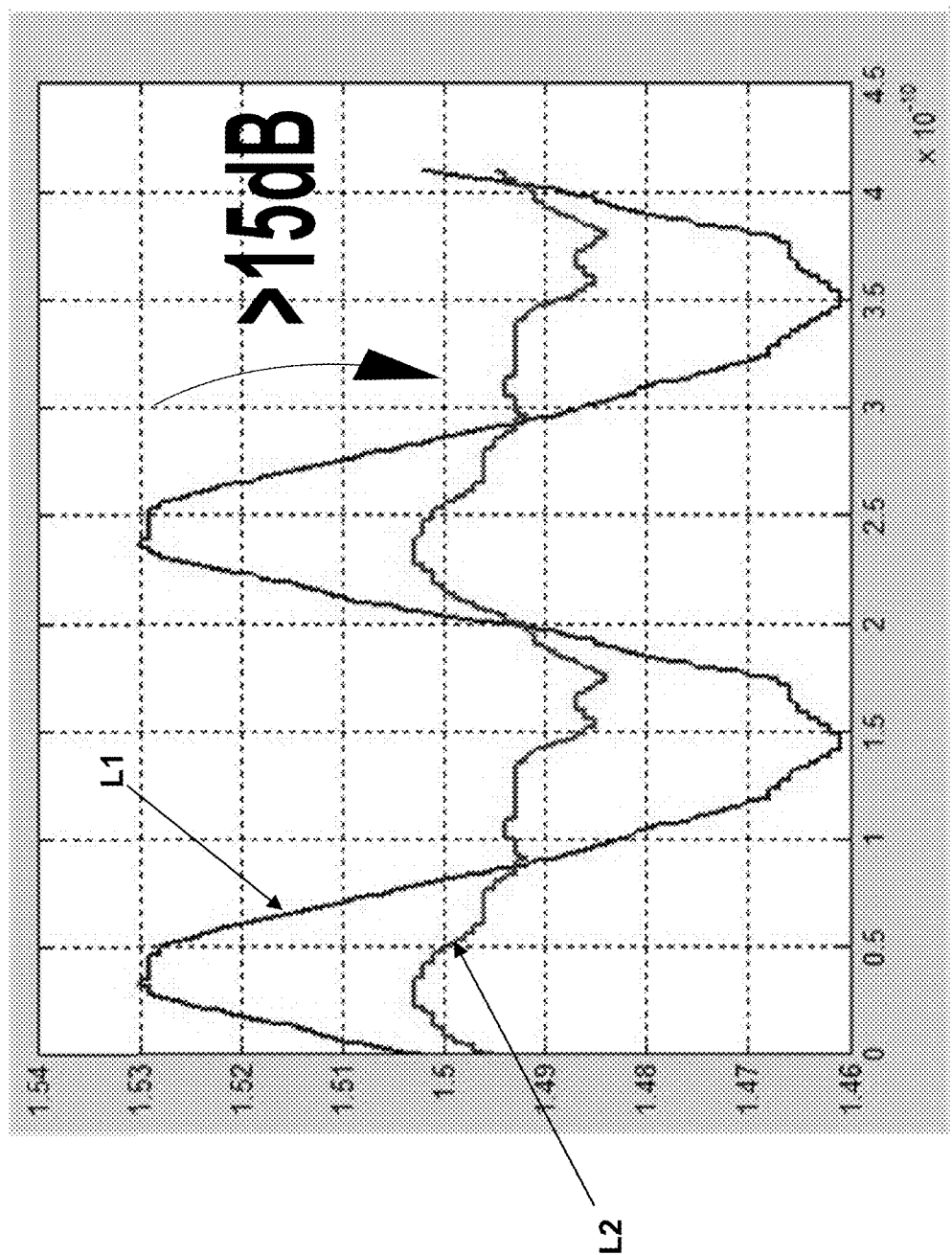
FIG. 9 is a schematic diagram showing two voltage fluctuation curves of a power supply voltage of the pseudo-differential circuit in FIG. 8 disturbed by an even harmonic current of an input signal, wherein L1 is a voltage fluctuation curve when the tuning capacitor is not disposed, and L2 is a voltage fluctuation curve after the tuning capacitor is disposed.

As shown in FIG. 9, when there are the even harmonic currents of the input signal in the pseudo-differential circuit, L1 is a voltage fluctuation curve of the power supply voltage VDD when the notch filter is not disposed, and L2 is a voltage fluctuation curve of the power supply voltage VDD after the notch filter is disposed. It can be seen that the voltage fluctuation is reduced by at least 15 dB since the notch filter is disposed.

In a preferable embodiment, the power supply voltage terminal VDD and the ground terminal GND are disposed adjacent to each other, and are coupled to corresponding nodes by parallel wires, thereby further reducing the magnetic field generated by the leaked even harmonic currents Ileak.

It is well known to those skilled in the art that the on-chip inductors in the present invention may be not only applied in the pseudo-differential circuit in the radio frequency integrated circuit as shown in FIG. 2, but also applied in other circuits that need to reduce the common mode coupling effect between the on-chip inductors. As described above, the voltage controlled oscillator disturbed by the even harmonic currents of the pseudo-differential circuit is taken as an example for introduction. Clearly, the voltage controlled oscillator may be replaced with any other circuit with an operating frequency proximate to the frequency of the even harmonic of the differential input signals and having an on-chip inductor. In addition, as described above, both the voltage controlled oscillator and the pseudo-differential circuit are located in one and the same radio frequency integrated circuit. Clearly, two circuits having a common mode coupling effect may not necessarily belong to a circuit with the same function, and may also belong to two independent circuits in function.

In summary, the present invention provide an integrated circuit formed in one and the same die, comprising a first circuit and a second circuit, which may be functionally related, or also may be unrelated. The first circuit comprises a first inductor and operates at a first frequency. The second circuit comprises a second inductor and processes an input signal. The frequency of the even harmonic of the input signal is near to the first frequency. As a result, the even harmonic of the input signal will affect the first inductor in the first circuit based on the second inductor, and finally affect the performance of the first circuit. To reduce the common mode coupling effect between the first inductor and the second inductor, the second inductor may adopt the on-chip inductor, e.g., as shown in FIG. 3A, FIG. 4A and FIG. 5A, which employs the magnetic field difference structure.

In a preferable embodiment, the second circuit further comprises a tuning capacitor coupled between the intermediate terminal of the second inductor and the ground terminal. The tuning capacitor and the second inductor form a notch filter having the resonant frequency being proximate or equal to the frequency of the even harmonic of the input signal.

The present invention has been described in sufficient details with a certain degree of particularity. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the foregoing description of embodiments.

What is claimed is:

1. An integrated circuit, comprising:
   a first circuit, operating at a first frequency, including a first inductor; and
   a second circuit, including a second inductor, provided to process an input signal, the second inductor including a first terminal, a second terminal, an intermediate terminal, and an intermediate node, wherein a first wire is formed between the first terminal and the intermediate node, a second wire is formed between the second terminal and the intermediate node, the first wire and the second wire, forming a coil with one or more turns, cross at a certain point on different layers, an intermediate tap is coupled between the intermediate node and the intermediate terminal, and the first and second terminals, and the intermediate terminal being located on one side of the coil and adjacent to each other, and
   wherein when a current flows from the first terminal of the second inductor to the intermediate terminal of the second inductor and a current flows from the second terminal of the second inductor to the intermediate terminal of the second inductor, or when a current flows from the intermediate terminal of the second inductor to the first terminal of the second inductor and a current flows from the intermediate terminal of the second inductor to the second terminal of the second inductor, intermediate tap are cancelled out substantially by each other.

2. The integrated circuit according to claim 1, wherein the second circuit is a pseudo-differential circuit and further comprises a first differential branch and a second differential branch, the first differential branch has a first terminal coupled with the first terminal of the second inductor, a second terminal coupled with a second power supply terminal and a first differential transistor disposed thereon;
   the second differential branch has a first terminal coupled with the second terminal of the second inductor, a second terminal coupled with the second power supply terminal and second differential transistor disposed thereon;
   the intermediate terminal of the second inductor is coupled with a first power supply terminal;
   the input signal of the second circuit is a pair of differential input signals, one of the pair of differential input signals is inputted to a control terminal of the first differential transistor and the other of the pair of differential input signals is inputted to a control terminal of the second differential transistor; and a power supply voltage is applied between the first power supply terminal and the second power supply terminal.

3. The integrated circuit according to claim 2, wherein the first power supply terminal is a power supply voltage terminal, the second power supply terminal is a ground terminal, the first power supply terminal and the second power supply terminal are disposed adjacent to each other, and are coupled to corresponding nodes via parallel wires.

4. The integrated circuit according to claim 2, wherein the first differential branch further comprises a first bias transistor, the second differential branch further comprises a second bias transistor, the first bias transistor and the first differential transistor are coupled in series between the first terminal of the first differential branch and the second terminal of the first differential branch, a control terminal of the first bias transistor is coupled with a bias voltage, the second bias transistor and the second differential transistor are coupled in series between the first terminal of the second differential branch and the second terminal of the second differential branch, and a control terminal of the second bias transistor is coupled with the bias voltage.

5. The integrated circuit according to claim 1, wherein the first circuit is a voltage controlled oscillator generating a clock signal with the first frequency based on the first inductor.

6. The integrated circuit according to claim 1, wherein the second circuit further comprises a tuning capacitor coupled between the intermediate terminal of the second inductor and the second power supply terminal, and the tuning capacitor and the second inductor form a notch filter having a resonant frequency being proximate or equal to the frequency of the even harmonic of the input signal.

7. The integrated circuit according to claim 1, wherein the first wire is symmetric with and the second wire along a symmetric axis, the first terminal of the second inductor is adjacent to the symmetric axis and located on one side of the symmetric axis, the second terminal of the second inductor is adjacent to the symmetric axis and located on the other side of the symmetric axis, and the intermediate tap of the second inductor is located on the symmetric axis.

8. The integrated circuit according to claim 1, wherein the number of turns of the coil formed by the first wire and the second wire is an even number and the intermediate tap does not pass through a center of the coil.

9. The integrated circuit according to claim 8, wherein when a current flows from the first terminal of the second inductor to the intermediate terminal of the second inductor and a current flows from the second terminal of the second inductor to the intermediate terminal of the second inductor, or when a current flows from the intermediate terminal of the second inductor to the first terminal of the second inductor and a current flows from the intermediate terminal of the second inductor to the second terminal of the second inductor, magnetic fields generated by the currents flowing on the coil formed by the first wire and the second wire can be cancelled out substantially by each other.

10. The integrated circuit according to claim 1, wherein the number of turns of the coil formed by the first wire and the second wire is an odd number, and the intermediate tap passes through a center of the coil.

11. The integrated circuit according to claim 10, wherein, when a current flows from the first terminal of the second inductor to the intermediate terminal of the second inductor and a current flows from the second terminal of the second inductor to the intermediate terminal of the second inductor, or when a current flows from the intermediate terminal of the second inductor to the first terminal of the second inductor and a current flows from the intermediate terminal of the second inductor to the second terminal of the second inductor, a magnetic field generated by the currents flowing on one turn of the coil coupled with the intermediate node directly are cancelled partially or completely by a magnetic field generated by the current flowing on the intermediate tap, and magnetic fields generated by the currents flowing on other turns of the coil are cancelled out substantially by each other.

* * * * *